United States Patent
Takahashi et al.

(10) Patent No.: US 8,169,782 B2
(45) Date of Patent: May 1, 2012

(54) ELECTRONIC CIRCUIT DEVICE

(75) Inventors: Ryohei Takahashi, Anjo (JP); Naotaka Murakami, Anjo (JP); Keiichi Tominaga, Nagoya (JP)

(73) Assignee: Aisin AW Co., Ltd., Aichi-Ken (JP)

( * ) Notice: Subject to any disclaimer, the term of this patent is extended or adjusted under 35 U.S.C. 154(b) by 140 days.

(21) Appl. No.: 12/813,918

(22) Filed: Jun. 11, 2010

(65) Prior Publication Data

US 2011/0007478 A1    Jan. 13, 2011

(30) Foreign Application Priority Data

Jul. 10, 2009   (JP) ................. 2009-164063

(51) Int. Cl.
  *H05K 7/20*   (2006.01)
(52) U.S. Cl. ........ 361/721; 361/719; 361/760; 361/764; 257/678; 257/687; 257/713; 174/16.3; 174/251; 174/252; 174/254; 29/825; 29/841; 29/848
(58) Field of Classification Search .................. 361/715, 361/719, 720–724, 749, 750, 751, 760–767, 361/776, 789–794; 257/676–687, 698, 66, 257/706–727, 737, 738, 778–782; 174/15.1, 174/16.3, 250–268, 35 R, 520–526, 538–540; 29/825–855; 439/64, 67, 358, 495, 496
See application file for complete search history.

(56) References Cited

U.S. PATENT DOCUMENTS

| | | | |
|---|---|---|---|
| 6,184,965 B1 * | 2/2001 | Murayama et al. ............ 349/150 |
| 6,320,128 B1 * | 11/2001 | Glovatsky et al. ............ 174/548 |
| 6,449,836 B1 * | 9/2002 | Miyake et al. ................. 29/830 |
| 6,570,773 B1 * | 5/2003 | Loibl et al. ..................... 361/752 |
| 6,652,312 B2 * | 11/2003 | Liegl et al. ..................... 439/519 |
| 7,080,575 B2 * | 7/2006 | Jungbauer et al. .......... 74/606 R |
| 7,233,382 B2 * | 6/2007 | Yamaji et al. ................. 349/150 |

(Continued)

FOREIGN PATENT DOCUMENTS

JP           9-181446 A          7/1997

(Continued)

OTHER PUBLICATIONS

International Search Report for corresponding International Patent Application No. PCT/JP2010/060096 mailed Jul. 20, 2010.

*Primary Examiner* — Michail V Datskovskiy
(74) *Attorney, Agent, or Firm* — Sughrue Mion, PLLC

(57) ABSTRACT

An electronic circuit device that suppresses deformation of an adhesive layer of a flexible printed circuit board during formation of a resin seal portion, and suppresses deterioration of the circuit board caused by deformation of the adhesive layer. The electronic circuit device includes a substrate mounted with an electronic component; a flexible printed circuit board electrically connectable to the substrate and an external device, and includes a wiring conductor and a pair of insulation films covering upper and lower surfaces of the wiring conductor; and a resin molding portion to seal the substrate and a portion of the circuit board. The wiring conductor of the circuit board is adhered through an adhesive layer to at least one of the pair of insulation films, and a dummy wiring material that does not function as wiring is disposed on an outer side of a border between the circuit board and an outer peripheral portion of the plastic molding portion, and disposed between the pair of insulation films.

4 Claims, 5 Drawing Sheets

U.S. PATENT DOCUMENTS

| | | | |
|---|---|---|---|
| 7,303,400 B2 * | 12/2007 | Sun et al. | 439/64 |
| 7,439,452 B2 * | 10/2008 | Masuda | 174/536 |
| 7,484,967 B2 * | 2/2009 | Ichino et al. | 439/67 |
| 7,545,649 B2 * | 6/2009 | Tan | 361/749 |
| 8,031,473 B2 * | 10/2011 | Beer et al. | 361/760 |
| 2007/0196044 A1 | 8/2007 | Nagura | |
| 2008/0286696 A1 | 11/2008 | Ueno et al. | |
| 2009/0067169 A1 * | 3/2009 | Helbig et al. | 362/234 |

FOREIGN PATENT DOCUMENTS

| | | |
|---|---|---|
| JP | 2006-108362 A | 4/2006 |
| JP | 2008-140995 A | 6/2008 |

* cited by examiner

F I G . 6
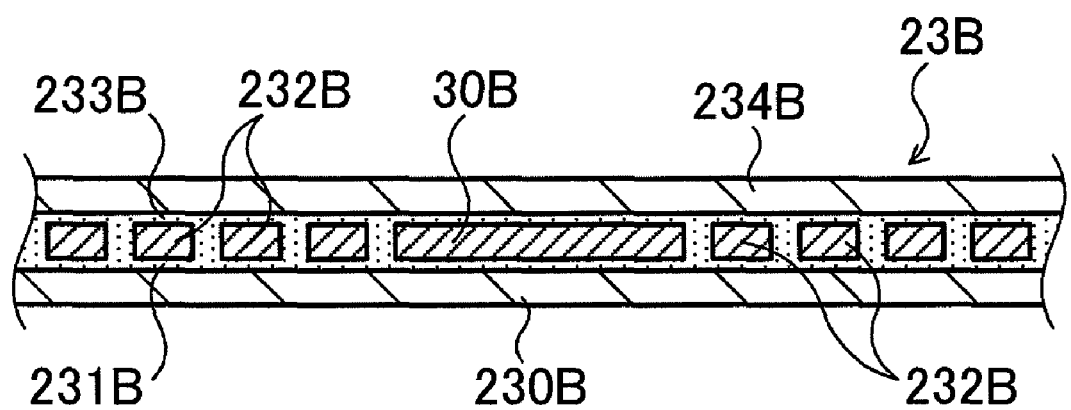

ELECTRONIC CIRCUIT DEVICE

INCORPORATION BY REFERENCE

The disclosure of Japanese Patent Application No. 2009-164063 filed on Jul. 10, 2009 including the specification, drawings and abstract is incorporated herein by reference in its entirety.

BACKGROUND OF THE INVENTION

The present invention relates to an electronic circuit device, and more specifically relates to an electronic circuit device that includes a substrate mounted with an electronic component.

DESCRIPTION OF THE RELATED ART

A conventional electronic circuit device of this type has been proposed that includes: a flexible printed circuit board with a first wiring pattern provided on one surface side of a base material having flexibility, and a second wiring pattern provided on another surface side of the base material; an electronic component that is mounted to the one surface side of the flexible printed circuit board and is electrically connected to the first wiring pattern; a first molded resin portion that is provided on the one surface side of the flexible printed circuit board and seals the electronic component; and a second molded resin portion that is provided on the other surface side of the flexible printed circuit board and seals at least a region facing the electronic component (see Japanese Patent Application Publication No. JP-A-2006-108362, for example). An outer peripheral edge of the first molded resin portion of the electronic circuit device and a region near the outer peripheral edge of the first molded resin portion does not have the first wiring pattern (on the front surface of an adhesion layer) on the front surface of the flexible printed circuit board, and does not have the first wiring pattern between the front surface of the flexible printed circuit board and the base material. An outer peripheral edge of the second molded resin portion and a region near the outer peripheral edge of the second molded resin portion does not have the second wiring pattern (on the front surface of a protection layer) on the front surface of the flexible printed circuit board, and does not have the second wiring pattern between the front surface of the flexible printed circuit board and the base material. Thus, in this electronic circuit device, a die closing pressure (clamping pressure) that is applied to the first and second wiring patterns during transfer molding of the molded resin portions, and which may cut or damage the first and second wiring patterns, can be suppressed. Consequently, the electronic component mounted on the flexible printed circuit board can be sealed by the molded resin portions without cutting or damaging the wiring patterns.

SUMMARY OF THE INVENTION

However, in an electronic circuit device such as that described above, if the first and second wiring patterns are designed so as not to exist between the top surface of the flexible printed circuit board and the base material on the outer peripheral edges of the first and second molded resin portions or in regions near the outer peripheral edges, the thickness of the adhesion layer increases at locations where the first and second wiring patterns do not exist, namely, the outer peripheral edges of the first and second molded resin portions and the regions near the outer peripheral edges. Consequently, even if the clamping pressure acting on the first and second wiring patterns can be suppressed during transfer molding of the molded resin portions, the thick adhesion layer deforms considerably due to the clamping pressure. If the adhesion layer deforms in this manner, so-called delamination or the like may occur in the flexible printed circuit board due to the deformation of the adhesion layer. Note that this type of deformation of the adhesion layer is not limited to a flexible printed circuit board having the multi-layer structure (double-sided structure) described in JP-A-2006-108362, and may also occur in a flexible printed circuit board having a single-layer structure (single-sided structure).

Hence, the present invention provides an electronic circuit device that suppresses deformation of an adhesive layer of a flexible printed circuit board during formation of a resin seal portion, and suppresses deterioration of the flexible printed circuit board caused by deformation of the adhesive layer.

The electronic circuit device of the present invention employs the following to achieve the above.

An electronic circuit device according to the present invention includes a substrate mounted with an electronic component; a flexible printed circuit board that is electrically connectable to the substrate and an external device, and includes a wiring conductor and a pair of insulation films that covers upper and lower surfaces of the wiring conductor; and a plastic molding portion made of resin that is molded so as to seal the substrate and a portion of the flexible printed circuit board. In the electronic circuit device, the wiring conductor of the flexible printed circuit board is adhered through an adhesive layer to at least one of the pair of insulation films, and a dummy wiring material that does not function as wiring is disposed on an outer side of a border between the flexible printed circuit board and an outer peripheral portion of the plastic molding portion, and disposed between the pair of insulation films.

According to the electronic circuit device, the wiring conductor of the flexible printed circuit board is adhered through an adhesive layer to at least one of the pair of insulation films. In addition, the dummy wiring material that does not function as wiring is disposed on the outer side of the border between the flexible printed circuit board and the outer peripheral portion of the plastic molding portion, and disposed between the pair of insulation films. Thus, the thickness of the adhesive layer around the dummy wiring material can be reduced because the dummy wiring material is disposed on the outer side of the border between the flexible printed circuit board and the outer peripheral portion of the plastic molding portion between the pair of insulation films. Therefore, during molding of the plastic molding portion, deformation of the adhesive layer can be suppressed, and deterioration of the flexible printed circuit board caused by deformation of the adhesive layer can be well suppressed.

The plastic molding portion may molded using an upper die and a lower die, and the dummy wiring material may be disposed on an inner surface side of a clamping area of the flexible printed circuit board that is subject to pressure from one of the upper die and the lower die in connection with clamping of the upper die and the lower die. Thus, the thickness of the adhesive layer near clamping area can be reduced because the dummy wiring material is disposed on the inner surface side of the clamping area of the flexible printed circuit board. Therefore, during molding of the plastic molding portion, deformation of the adhesive layer due to a clamping pressure can be suppressed, and deterioration of the flexible printed circuit board caused by deformation of the adhesive layer can be well suppressed.

The electronic circuit device may further include a heat radiation member that is adhered to the flexible printed circuit board. The plastic molding portion may seal the substrate, a portion of the flexible printed circuit board, and a portion of the heat radiation member. The flexible printed circuit board may include a first insulation film that is adhered to the heat radiation member, a second insulation film that is not adhered to the heat radiation member, a first wiring conductor that is covered by the first insulation film and an intermediate film having an insulation property, and a second wiring conductor that is covered by the intermediate film and the second insulation film. The first wiring conductor may be adhered through an adhesive layer to at least one of the first insulation film and the intermediate film. The second wiring conductor may be adhered through an adhesive layer to at least one of the intermediate film and the second insulation film. The dummy wiring material may be formed from the same material as the second wiring conductor, and disposed in the same layer as the second wiring conductor at a location where the second wiring conductor does not exist on the inner surface side of the clamping area. In the electronic circuit device that includes the flexible printed circuit board having a multi-layer structure and the heat radiation member adhered to the flexible printed circuit board as described above, during molding of the plastic molding portion, the clamping pressure directly acts on the heat radiation member that is adhered to the first insulation film of the flexible printed circuit board and on the second insulation film of the flexible printed circuit board, which is not adhered to the heat radiation member. Thus, in the electronic circuit device, if the dummy wiring material is disposed in the same layer as the second wiring conductor at a location where the second wiring conductor does not exist on the inner surface side of the clamping area between the second insulation film that is not adhered to the heat radiation member and the intermediate film, the thickness of the adhesive layer between the second insulation film and the intermediate film near the clamping area can be reduced. Therefore, during molding of the plastic molding portion, deformation of the adhesive layer between the second insulation film and the intermediate film near the clamping area, and deterioration of the flexible printed circuit board caused by deformation of the adhesive layer can be well suppressed. If the dummy wiring material is formed from the same material as the second wiring conductor, then during manufacture of the flexible printed circuit board, the dummy wiring material can be easily formed at a location where the second wiring conductor does not exist on the inner surface side of the clamping area. Note that the dummy wiring material may be disposed in the same layer as the first wiring conductor at a location where the first wiring conductor does not exist on the inner surface side of the clamping area between the first insulation film that is adhered to the heat radiation member and the intermediate film.

In the electronic circuit device, the dummy wiring material may be formed from the same material as the wiring conductor, and disposed in the same layer as the wiring conductor at a location where the wiring conductor does not exist on the inner surface side of the clamping area. Thus, in the electronic circuit device that includes a flexible printed circuit board having a single-layer structure, the thickness of the adhesive layer between the pair of insulation films near the clamping area can be reduced. Therefore, during molding of the plastic molding portion, deformation of the adhesive layer between the pair of insulation films near the clamping area, and deterioration of the flexible printed circuit board caused by deformation of the adhesive layer can be well suppressed. If the dummy wiring material is formed from the same material as the wiring conductor, then during manufacture of the flexible printed circuit board, the dummy wiring material can be easily formed at a location where the wiring conductor does not exist on the inner surface side of the clamping area.

BRIEF DESCRIPTION OF THE DRAWINGS

FIG. 6 is a cross-sectional view that illustrates an example of a flexible printed circuit board 23B according to a modification.

DETAILED DESCRIPTION OF THE EMBODIMENT

Next, a best mode for carrying out the present invention will be described based on an embodiment.

Figure 1:
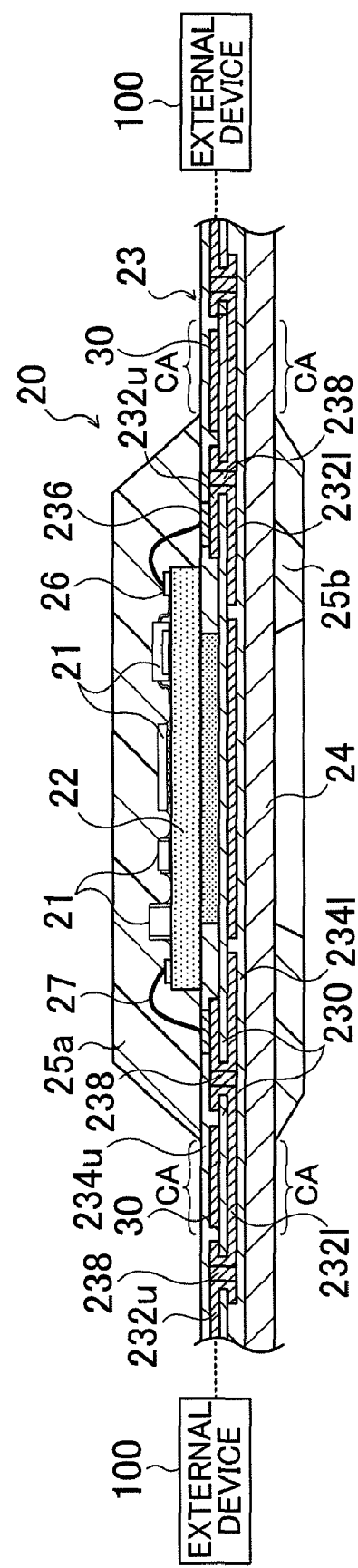
FIG. 1 is a cross-sectional view that shows an electronic circuit device 20 according to an embodiment of the present invention.

FIG. 1 is a cross-sectional view that shows an electronic circuit device 20 according to an embodiment of the present invention. The electronic circuit device 20 of the embodiment shown in the drawing is configured as an electronic control device that controls a vehicle automatic transmission not shown in the drawing, and may be installed on a unit mount fixed to a lower portion of a transmission case. The electronic circuit device 20 of the embodiment includes: a substrate 22 mounted with various electronic components 21; a flexible printed circuit board (FPC) 23 that is adhered to the substrate 22 and can be electrically connected to the substrate 22 and an external device 100; a heat radiation plate (heat sink) 24 that is adhered to the flexible printed circuit board 23; and plastic molding portions 25a and 25b that are made of resin and formed so as to seal a portion of the flexible printed circuit board 23, a portion of the heat radiation plate 24, and the substrate 22.

The substrate 22 is made of a base material formed from a material having excellent heat resistance and heat conductivity, and a relatively small heat expansion coefficient, such as ceramic. The substrate 22 has a wiring pattern formed on one surface of the base material. The surface of the substrate 22 formed with the wiring pattern is a mounting surface for the plurality of electronic components 21, starting with an IC chip. A plurality of bonding terminals (circuit side connection terminals) 26 connected to the wiring pattern is arranged on the mounting surface.

Figure 2:
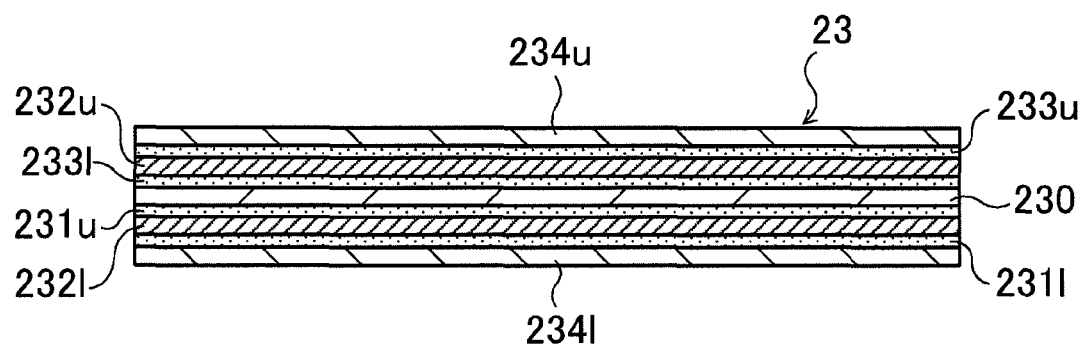
FIG. 2 is a cross-sectional view of a flexible printed circuit board 23 included in the electronic circuit device 20.

The flexible printed circuit board 23 is a deformable wiring material having flexibility, and has a thickness of approximately 1 to 0.2 millimeters, for example. As shown in FIG. 2, the flexible printed circuit board 23 included in the electronic circuit device 20 of the embodiment has a multi-layer structure (double-sided structure). The flexible printed circuit board 23 includes: a base film (intermediate film) 230 made of resin having insulation properties such as polyimide resin; a first wiring conductor 232*l* that is formed from copper foil or the like and adhesively attached to one surface of the base film 230 through an adhesive layer 231*u*; a first cover film (first insulation film) 234*l* that is adhesively attached to the first wiring conductor 232*l* and the base film 230 through an adhesive layer 231*l*, and that covers the first wiring conductor 232*l*; a second wiring conductor 232*u* that is formed from copper foil or the like and adhesively attached to another surface of the base film 230 through an adhesive layer 233*l*; and a second cover film (second insulation film) 234*u* that is adhesively attached to the second wiring conductor 232*u* and the base film 230 through an adhesive layer 233*u*, and that covers the second wiring conductor 232*u*.

The first and second cover films 234*l*, 234*u* are also made of resin having insulation properties such as polyimide resin. As shown in FIG. 1, in the embodiment, a back surface (non-mounting surface) of the substrate 22 is adhered to the second cover film 234*u*. The flexible printed circuit board 23 of the embodiment, as FIG. 1 shows, has a plurality of bonding terminals (circuit board side connection terminals) 236 that are respectively connected to the corresponding second wiring conductors 232*u*. Each of the bonding terminals 236 is exposed from the second cover film 234*u*, and connected to the corresponding bonding terminal 26 of the substrate 22 through a bonding wire 27. Furthermore, the flexible printed circuit board 23 (mainly the first wiring conductor 232*l*) is connected to a connector (not shown) and also connected to the external device 100. The external device 100 connected to the substrate 22 through the flexible printed circuit board 23 includes: a solenoid valve included in a hydraulic circuit that operates a hydraulic clutch or a hydraulic brake of the automatic transmission; various types of sensors such as an oil temperature sensor and a hydraulic pressure sensor; and other electronic control units.

The flexible printed circuit board 23 of the embodiment is manufactured as follows. Copper foil is adhesively attached to the front and back surfaces of the base film 230 through the adhesive layers 231*u*, 233*l*. The front and back surfaces of the base film 230 are formed with the pattern of the first wiring conductor 232*l* and the pattern of the second wiring conductor 232*u* through etching or the like. The first cover film 234*l* and the second cover film 234*u* are then adhesively attached to the base film 230 and the first and second wiring conductors 232*l*, 232*u* through the adhesive layers 231*l*, 233*u*. Thus, the adhesive layer 231*u* and the adhesive layer 231*l* are integrated and formed in practice as one adhesive layer in a region where the first wiring conductor 232*l* does not exist between the base film 230 and the first cover film 234*l*. Likewise, the adhesive layer 233*l* and the adhesive layer 233*u* are formed in practice as one adhesive layer 233 in a region where the second wiring conductor 232*u* does not exist between the base film 230 and the second cover film 234*u* (see FIG. 3).

The heat radiation plate 24 in the embodiment is, for example, a rectangular plate body formed from a low-expansivity metal having excellent heat conductivity and a relatively small heat expansion coefficient, such as common steel (SPCC) or clad material. As shown in FIG. 1, the heat radiation plate 24 is adhered to the flexible printed circuit board 23 on a side opposite to the substrate 22, that is, to the first cover film 234*l* of the flexible printed circuit board 23. In the embodiment, after joining the first cover film 234*l* of the flexible printed circuit board 23 and the heat radiation plate 24, the substrate 22 is adhered to the second cover film 234*u* of the flexible printed circuit board 23, thereby integrating the substrate 22, the flexible printed circuit board 23, and the heat radiation plate 24.

Figure 4:
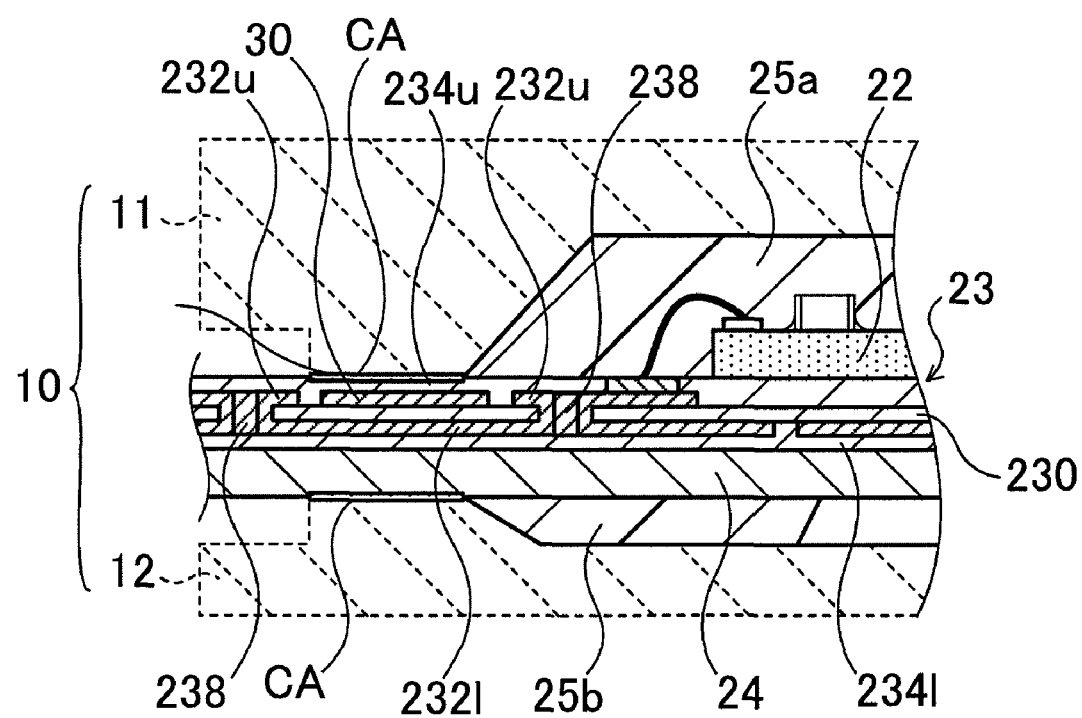
FIG. 4 is a cross-sectional view for explaining a manufacturing process of the electronic circuit device 20.

The plastic molding portions 25*a* and 25*b* are formed by transfer molding as follows. As shown in FIG. 4, the integrated substrate 22, flexible printed circuit board 23 and heat radiation plate 24 are set in a cavity of a molding die 10 formed from an upper die 11 and a lower die 12. A thermosetting resin such as epoxy resin is then heated and pressurized so as to melt, and the melted resin is injected and pressurized within the cavity of the molding die 10 via a pot not shown in the drawing. As shown in FIG. 1, the plastic molding portion 25*a* on the upper side in the drawing seals the substrate 22 and a portion of the flexible printed circuit board 23, while the plastic molding portion 25*b* on the lower side in the drawing seals a portion of the heat radiation plate 24. The shape (mass) and position of the plastic molding portion 25*a* on the upper side in the drawing and the plastic molding portion 25*b* on the lower side in the drawing is determined so as to relieve stress acting between the plastic molding portions 25*a*, 25*b* and other members. Note that automatic transmission fluid (ATF) is guided to the unit mount of the automatic transmission where the electronic circuit device 20 of the embodiment is disposed. Heat generated by the substrate 22 is released to outside due to the exchange of heat among an exposed portion of the heat radiation plate 24 not sealed by the plastic molding portions 25*a* and 25*b*, the front surfaces of the plastic molding portions 25*a* and 25*b*, and the ATF.

Here, in the electronic circuit board 20 of the embodiment, during molding of the plastic molding portions 25*a* and 25*b*, a pressure (clamping pressure) resulting from clamping of the molding die 10 directly acts on the heat radiation plate 24 adhered to the first cover film 234*l* of the flexible printed circuit board 23 and also acts on the second cover film 234*u* of the flexible printed circuit board 23, which is not adhered to the heat radiation plate 24. In other words, in the electronic circuit device 20 of the embodiment, during transfer molding of the plastic molding portions 25*a*, 25*b*, a pressure (clamping pressure) from the upper die 11 is applied to a clamping area CA (of the second cover film 234*u*) of the flexible printed circuit board 23 contacting the upper die 11 (see FIGS. 1 and 4). In addition, during transfer molding of the plastic molding portions 25*a*, 25*b*, a pressure (clamping pressure) from the lower die 12 is applied to a clamping area CA of the heat radiation plate 24 contacting the lower die 12 (see FIGS. 1 and 4). Thus, because the clamping pressure is received by the heat radiation plate 24, a region on the heat radiation plate 24 side of the flexible printed circuit board 23 is relatively less prone to the influence of the clamping pressure. On the contrary, a region on the substrate 22 side of the flexible printed circuit board 23 is relatively more prone to the influence of the clamping pressure because the clamping pressure directly acts on the second cover film 234*u* (clamping area CA). Therefore, in the electronic circuit device 20 of the embodiment, as shown in FIGS. 1 and 4, a through hole 238 or the like is used to connect the second wiring conductor 232*u* on the substrate 22 side and the first wiring conductor 232*l* on the heat radiation plate 24 side. Consequently, the wiring conductor (copper foil) 232*u* does not exist on the inner surface side of the clamping area CA of the flexible printed circuit board 23 between the second cover film 234*u* and the base film 230 (the wiring conductor is arranged in a roundabout manner on the second cover film 234*u* side). Thus, disconnection of the second wiring conductor 232*u* on the substrate 22 side due to clamping of the molding die 10 for molding of the plastic molding portions 25*a*, 25*b* can be suppressed.

Figure 3:
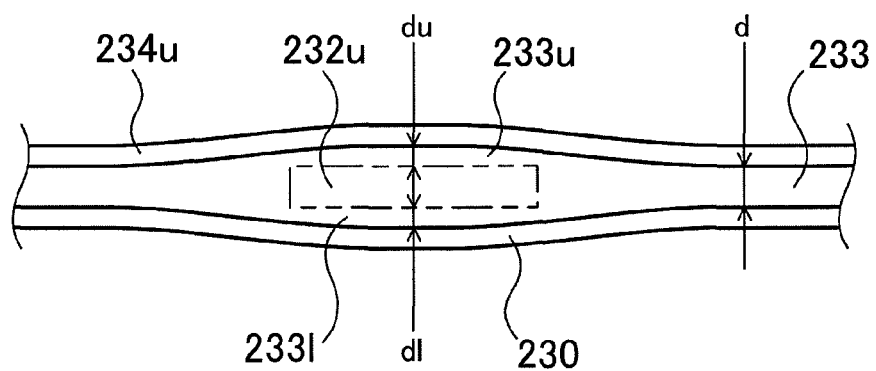
FIG. 3 is a schematic diagram that illustrates an example of a portion of the flexible printed circuit board 23.

However, if the second wiring conductor 232*u* does not exist on the inner surface side of the clamping area CA of the flexible printed circuit board 23 (second cover film 234*u*) between the second cover film 234*u* and the base film 230, one adhesive layer 233 will be formed in practice by the adhesive layer 233*l* and the adhesive layer 233*u* as shown in FIG. 3 unless a countermeasure is taken in some form. Consequently, a thickness d of the adhesive layer 233 becomes larger than thicknesses dl, du of the adhesive layers 233*l*, 233*u*, which are positioned below and above the second wiring conductor 232u between the second cover film 234u and the base film 230. The thick adhesive layer 233 described above may deform considerably due to the clamping pressure during molding of the plastic molding portion 25a and the like, and result in deformation of the adhesive layer 233. As a consequence, so-called delamination or the like may occur in the flexible printed circuit board 23 due to the deformation of the adhesive layer 233. Likewise, unless a countermeasure is taken in some form, a thick adhesive layer is also formed by the adhesive layer 231l and the adhesive layer 231u at a location where the first wiring conductor 232l does not exist on the inner surface side of the clamping area CA of the heat radiation plate 24 between the first cover film 234l and the base film 230. If the clamping pressure acts on the thick adhesive layer on the first cover film 234l side, the adhesive layer deforms and such deformation may cause so-called delamination or the like in the flexible printed circuit board 23.

Figure 5:
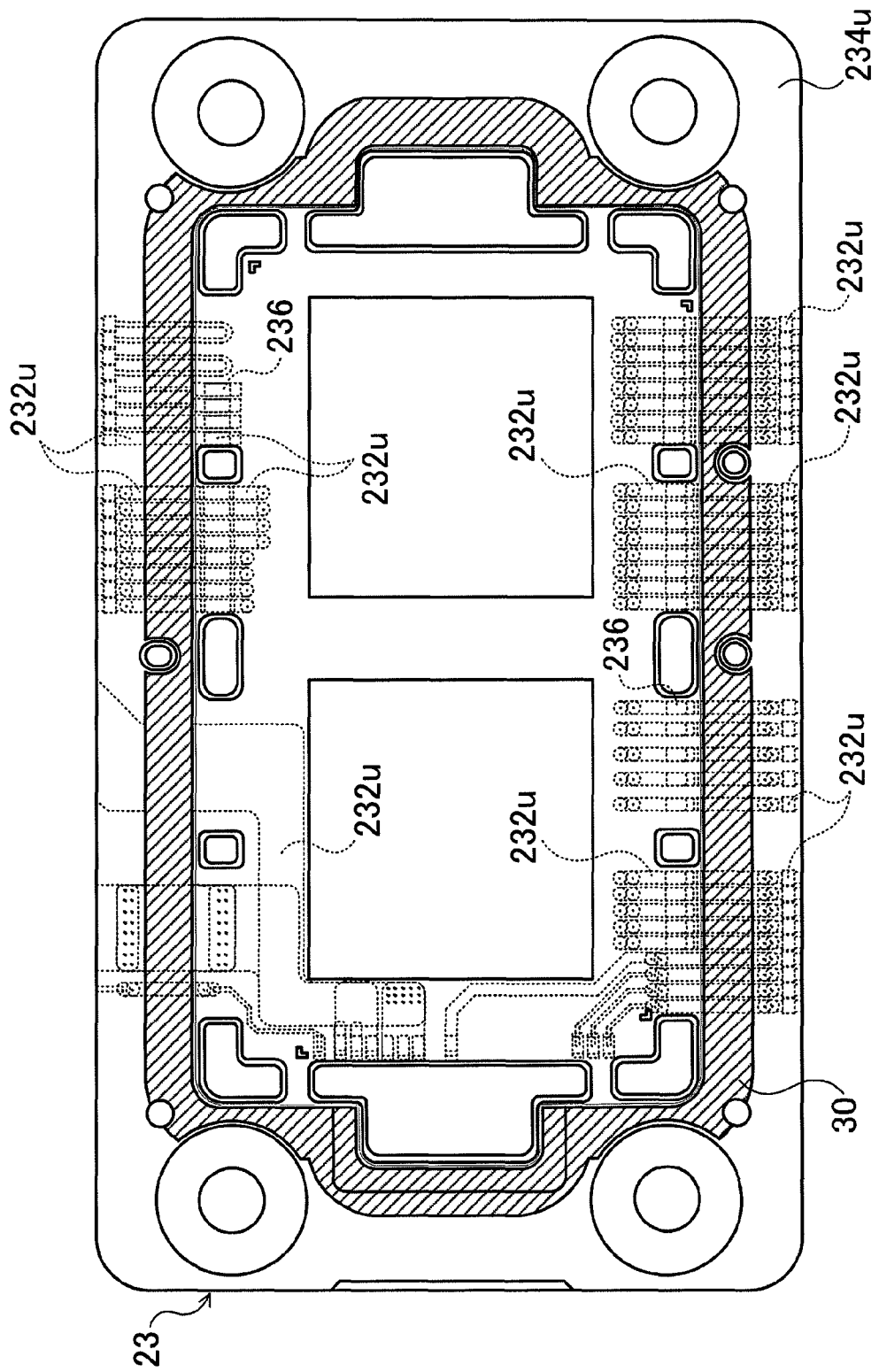
FIG. 5 is a plane view of the flexible printed circuit board 23 included in the electronic circuit device 20.

In light of this, according to the electronic circuit device 20 of the embodiment and as shown in FIGS. 1, 4, and 5, a dummy wiring material 30 that does not function as wiring is formed from the same material (copper foil) as the second wiring conductor 232u. The dummy wiring material 30 is disposed at a location where the second wiring conductor 232u does not exist on the outer side of the border between the flexible printed circuit board 23 and the outer peripheral portion of the plastic molding portion 25a, and disposed between the second cover film 234u and the base film 230, namely, on the inner surface side of the clamping area CA of the flexible printed circuit board 23 between the second cover film 234u that is not adhered to the heat radiation plate 24 and the base film 230. In other words, in the embodiment, copper foil is adhesively attached to the base film 230 through the adhesive layer 233l. The pattern of the second wiring conductor 232u is formed on the base film 230 and the pattern of the dummy wiring material 30 is formed on the base film 230 away from the second wiring conductor 232u through etching or the like. The second cover film 234u is then adhesively attached to the base film 230 and the like through the adhesive layer 233u. Thus, the dummy wiring material 30 is disposed in the same layer as the second wiring conductor 232u at a location where the second wiring conductor 232u does not exist on the inner surface side of the clamping area CA. Furthermore, in the embodiment, copper foil is adhesively attached to the base film 230 through the adhesive layer 231u. The pattern of the first wiring conductor 232l is formed on the base film 230 and the pattern of a dummy wiring material (not shown) is formed on the base film 230 away from the first wiring conductor 232l through etching or the like. The first cover film 234l is then adhesively attached to the base film 230 and the like through the adhesive layer 231l. Thus, the dummy wiring material (not shown), which is formed from the same material (copper foil) as the first wiring conductor 232l and does not function as wiring, is disposed at a location where the first wiring conductor 232l does not exist on the outer side of the border between the heat radiation plate 24 and the outer peripheral portion of the plastic molding portion 25b, and disposed between the first cover film 234l and the base film 230, namely, on the inner surface side of the clamping area CA of the heat radiation plate 24 between the first cover film 234l that is adhered to the heat radiation plate 24 and the base film 230. Note that in the embodiment, the pattern of the dummy wiring material 30 on the second cover film 234u side is a generally continuous rectangular shape along the outer periphery of the plastic molding portion 25a, as shown in FIG. 5, while the dummy wiring material on the first cover film 234l side is provided in a dispersed manner so as not to contact the first wiring conductor 232l in the same layer.

As described above, in the electronic circuit device 20 of the embodiment, the dummy wiring material 30 that does not function as wiring is disposed on the outer side of the border between the flexible printed circuit board 23 and the outer peripheral portion of the plastic molding portion 25a, and disposed between the second cover film 234u and the base film 230. In addition, a dummy wiring material (not shown) that does not function as wiring is disposed on the outer side of the border between the heat radiation plate 24 and the outer peripheral portion of the plastic molding portion 25b, and disposed between the first cover film 234l and the base film 230. In other words, in the electronic circuit device 20 of the embodiment, the dummy wiring material 30, which is formed from the same material (copper foil) as the second wiring conductor 232u and does not function as wiring, is disposed at a location where the second wiring conductor 232u does not exist on the inner surface side of the clamping area CA of the flexible printed circuit board 23 between the second cover film 234u that is not adhered to the heat radiation plate 24 and the base film 230. Furthermore, a dummy wiring material (not shown), which is formed from the same material (copper foil) as the first wiring conductor 232l and does not function as wiring, is disposed at a location where the first wiring conductor 232l does not exist on the inner surface side of the clamping area CA of the heat radiation plate 24 between the first cover film 234l that is adhered to the heat radiation plate 24 and the base film 230.

This ensures to the greatest possible extent that one adhesive layer 233 is not formed in practice from the adhesive layer 233l and the adhesive layer 233u between the second cover film 234u and the base film 230 near the clamping area CA of the flexible printed circuit board 23. This also ensures to the greatest possible extent that one adhesive layer is not formed in practice from the adhesive layer 231l and the adhesive layer 231u between the first cover film 234l and the base film 230 near the clamping area CA of the heat radiation plate 24. In other words, in the electronic circuit device 20 of the embodiment, the thickness of the adhesive layer near clamping area CA can be reduced. Therefore, during molding of the plastic molding portions 25a, 25b, deformation of the adhesive layer due to the clamping pressure can be suppressed, and deterioration such as delamination of the flexible printed circuit board 23 caused by deformation of the adhesive layer can be well suppressed. Furthermore, if the dummy wiring material 30 is formed using the same material (copper foil) as the first and second wiring conductors 232l, 232u as in the above embodiment, during manufacture of the flexible printed circuit board 23, the dummy wiring material 30 or the like can be easily formed on the inner surface side of the clamping areas CA of the flexible printed circuit board 23 and the heat radiation plate 24, and also formed in the same layer as the first and second wiring conductors 232l, 232u.

Note that the dummy wiring material 30 or the like may be disposed on the inner surface side of the clamping area CA. However, as shown in FIGS. 1 and 4, in order to secure strength the dummy wiring material 30 or the like may extend up to the inner side of the border between the flexible printed circuit board 23 and the outer peripheral portion of the plastic molding portion 25a and the border between the heat radiation plate 24 and the outer peripheral portion of the plastic molding portion 25b. In the electronic circuit device 20 that includes the flexible printed circuit board 23 having a multi-layer structure and the heat radiation plate 24 adhered to the flexible printed circuit board 23, during molding of the plastic molding portions 25a, 25b, a clamping pressure directly acts on the heat radiation plate 24 that is adhered to the first cover film 234*l* of the flexible printed circuit board 23 and on the second cover film 234*u* of the flexible printed circuit board 23, which is not adhered to the heat radiation plate 24. Thus, the region on the heat radiation plate 24 side of the flexible printed circuit board 23 is relatively less prone to the influence of the clamping pressure as described above. Therefore, the dummy wiring material on the first cover film 234*l* side adhered to the heat radiation plate 24 may be omitted.

In the flexible printed circuit board 23 shown in FIG. 2, the adhesive layer 231*u* and the adhesive layer 233*l* on the base film 23 side may be omitted, and the first wiring conductor 232*l* and a dummy wiring material (not shown) as well as the second wiring conductor 232*u* and the dummy wiring material 30 may be respectively adhesively attached to the base film 230 by heat welding. In the flexible printed circuit board 23 shown in FIG. 2, the adhesive layer 231*l* and the adhesive layer 233*u* on the first and second cover film 234*l*, 234*u* sides may be omitted, and the first wiring conductor 232*l* and a dummy wiring material (not shown) as well as the second wiring conductor 232*u* and the dummy wiring material 30 may be respectively adhesively attached to the first cover film 234*l* and the second cover film 234*u* by heat welding. In these cases, the thickness of the adhesive layer 231*l* or 231*u* increases in the region where the first wiring conductor 232*l* does not exist between the base film 230 and the first cover film 234*l*, and the thickness of the adhesive layer 233*u* or 233*l* increases in the region where the second wiring conductor 232*u* does not exist between the base film 230 and the second cover film 234*u*. In these cases as well, the dummy wiring material 30 is disposed in the same layer as the second wiring conductor 232*u* at a location where the second wiring conductor 232*u* does not exist on the inner surface side of the clamping area CA of the flexible printed circuit board 23, and a dummy material (not shown) is disposed in the same layer as the first wiring conductor 232*l* at a location where the first wiring conductor 232*l* does not exist on the inner surface side of the clamping area CA of the heat radiation plate 24. The thickness of the adhesive layer near the clamping area CA can thus be reduced. Therefore, during molding of the plastic molding portions 25a, 25b, deformation of the adhesive layer due to the clamping pressure can be suppressed, and deterioration such as delamination of the flexible printed circuit board 23 caused by deformation of the adhesive layer can be well suppressed.

A flexible printed circuit board 23B having a single-layer structure (single-sided structure) such as that shown in FIG. 6 may be applied to the electronic circuit device 20 described above instead of the flexible printed circuit board 23 having a multi-layer (double-sided) structure. The flexible printed circuit board 23B shown in FIG. 6 includes: a base film 230B serving as a first insulation film that is formed from resin such as polyimide resin; a wiring conductor 232B that is formed from copper foil or the like adhesively attached onto the base film 230B through an adhesive layer 231B; and a cover film 234B serving as a second insulation film that is adhesively attached to the wiring conductor 232B and the base film 230B through an adhesive layer 233B, and covers the wiring conductor 232B. If the flexible printed circuit board 23B described above is used, a dummy wiring material 30B may be disposed in the same layer as the wiring conductor 232B at a location where the wiring conductor 232B does not exist on an inner surface side of a clamping area. Thus, in the electronic circuit device 20 that includes the flexible printed circuit board 23B having a single-layer structure, the thickness of the adhesive layer between the base film 230B and the cover film 234B, which are a pair of front and back layers, near the clamping area can be reduced. Therefore, during molding of the plastic molding portions 25a, 25b, deformation of the adhesive layer between the base film 230B and the cover film 234B near the clamping area, and deterioration such as delamination of the flexible printed circuit board 23B caused by deformation of the adhesive layer can be well suppressed. Note that the wiring conductor 232B and the dummy wiring material 30B may be adhesively attached to one of the base film 230B and the cover film 234B by heat welding. In addition, a flexible printed circuit board having a multi-layer structure with three or more layers may obviously be applied to the electronic circuit device 20 described above.

In the electronic circuit device 20 described above, the heat radiation plate 24 may be omitted. Furthermore, although the electronic circuit device 20 was described above as being used for controlling a vehicle automatic transmission, the electronic circuit device 20 is not limited to such use. In other words, the electronic circuit device 20 may be configured as an electronic control unit that controls other on-vehicle devices, such as an internal combustion engine or a motor, for example. The electronic circuit device 20 may also be configured as an electronic circuit device that controls or otherwise operates a device other than an on-vehicle device.

Here, the correspondence relation will be described between main elements in the embodiment and modification and main elements of the invention as listed in the Summary of the Invention. Namely, in the embodiment and the modification, the substrate 22 mounted with the electronic component 21 corresponds to a "substrate"; the flexible printed circuit boards 23, 23B electrically connectable to the substrate 22 and the external device 100 correspond to a "flexible printed circuit board"; the plastic molding portions 25a and 25b made of resin and formed so as to seal the substrate 22, a portion of the flexible printed circuit board 23 and the like, and a portion of the heat radiation plate 24 correspond to a "plastic molding portion"; and the dummy wiring materials 30, 30B correspond to a "dummy wiring material". The first cover film 234*l*, the base films 230, 230B, the second cover film 234*u*, and the cover film 234B correspond to an "insulation film"; the first wiring conductor 232*l*, the second wiring conductor 232*u*, and the wiring conductor 232B correspond to a "wiring conductor"; the base film 230 corresponds to an "intermediate film"; and the adhesive layers 231*l*, 231*u*, 231B, 233*l*, 233*u*, and 233B correspond to an "adhesive layer".

The above embodiment was used to describe a mode for carrying out the present invention. However, the present invention is not particularly limited to such an example, and may obviously be carried out using various embodiments without departing from the scope of the present invention.

The present invention may be used in the electronic circuit device manufacturing industry.

What is claimed is:

1. An electronic circuit device comprising:
   a substrate mounted with an electronic component;
   a flexible printed circuit board that is electrically connectable to the substrate and an external device, and includes a wiring conductor and a pair of insulation films that covers upper and lower surfaces of the wiring conductor; and
   a plastic molding portion made of resin that is molded so as to seal the substrate and a portion of the flexible printed circuit board, wherein
   the wiring conductor of the flexible printed circuit board is adhered through an adhesive layer to at least one of the pair of insulation films, and a dummy wiring material that does not function as wiring is disposed on an outer side of a border between the flexible printed circuit board and an outer peripheral portion of the plastic molding portion, and disposed between the pair of insulation films.

2. The electronic circuit device according to claim 1, wherein the plastic molding portion is molded using an upper die and a lower die, and the dummy wiring material is disposed on an inner surface side of a clamping area of the flexible printed circuit board that is subject to pressure from one of the upper die and the lower die in connection with clamping of the upper die and the lower die.

3. The electronic circuit device according to claim 2, further comprising:

a heat radiation member that is adhered to the flexible printed circuit board, wherein the plastic molding portion seals the substrate, a portion of the flexible printed circuit board, and a portion of the heat radiation member, the flexible printed circuit board includes a first insulation film that is adhered to the heat radiation member, a second insulation film that is not adhered to the heat radiation member, a first wiring conductor that is covered by the first insulation film and an intermediate film having an insulation property, and a second wiring conductor that is covered by the intermediate film and the second insulation film, the first wiring conductor is adhered through an adhesive layer to at least one of the first insulation film and the intermediate film, the second wiring conductor is adhered through an adhesive layer to at least one of the intermediate film and the second insulation film, and the dummy wiring material is formed from the same material as the second wiring conductor, and disposed in the same layer as the second wiring conductor at a location where the second wiring conductor does not exist on the inner surface side of the clamping area.

4. The electronic circuit device according to claim 2, wherein the dummy wiring material is formed from the same material as the wiring conductor, and disposed in the same layer as the wiring conductor at a location where the wiring conductor does not exist on the inner surface side of the clamping area.

* * * * *